United States Patent [19]

Cargille

[11] Patent Number: 5,304,863

[45] Date of Patent: Apr. 19, 1994

[54] TRANSFORMER DRIVER HAVING UNLIMITED DUTY CYCLE CAPABILITY BY INSERTING NARROW PULSES DURING UNLIMITED DUTY CYCLES

[75] Inventor: Donald R. Cargille, Culver City, Calif.

[73] Assignee: Hughes Aircraft Company, Los Angeles, Calif.

[21] Appl. No.: 939,562

[22] Filed: Sep. 2, 1992

Related U.S. Application Data

[63] Continuation of Ser. No. 733,936, Aug. 30, 1991, abandoned.

[51] Int. Cl.$^5$ ............................ H03K 3/45; H03K 3/30
[52] U.S. Cl. ............................ 307/314; 307/282; 307/246; 307/270; 328/33
[58] Field of Search ............... 307/571, 575, 577, 572, 307/246, 270, 314, 282; 328/33, 65

[56] References Cited

U.S. PATENT DOCUMENTS

| | | | |
|---|---|---|---|
| 3,610,963 | 10/1971 | Higgins | 307/282 |
| 3,700,913 | 10/1972 | Dahlinger et al. | 307/107 |
| 4,329,595 | 5/1982 | Watson | 307/107 |
| 4,461,966 | 7/1984 | Hebenstreit | 307/571 |
| 4,511,815 | 4/1985 | Wood | 307/246 |
| 4,629,971 | 12/1986 | Kirk | 307/270 |
| 4,694,206 | 9/1987 | Weinberg | 307/571 |
| 4,774,419 | 9/1988 | D'Ariano | 307/314 |
| 4,967,101 | 10/1990 | Nakamura et al. | 307/571 |
| 4,970,420 | 11/1990 | Billings | 307/571 |
| 5,055,722 | 10/1991 | Latos et al. | 307/571 |

OTHER PUBLICATIONS

Wood, "Transformer-Isolated HEXFET Driver Provides very large duty cycle ratios," Application Notes, Chapter 9, pp. I-75 through I-77.
Fundamentals of Logic Design, Second Edition by Charles H. Roth, Jr. University of Texas.
The Design of Digital Systems, McGraw-Hill Book Company by John B. Peatman, The Georgia Institute of Technology.
"Transformer-Isolated HEXFET Driver Provides very large duty cycle ratios" *International Rectifier HEXFET Power Mosfet Designer's Manual*, Chapter 9, Application Note 950A (1987).

*Primary Examiner*—William L. Sikes
*Assistant Examiner*—Toan Tran
*Attorney, Agent, or Firm*—Gordon R. Lindeen, III; William J. Streeter; Wanda K. Denson-Low

[57] ABSTRACT

A transformer driver having an unlimited duty cycle capability is disclosed herein. The transformer driver 10 of the present invention is coupled to an output circuit 20 and includes a transformer 32 having primary winding and secondary windings 30 and 34. The inventive driver 10 further includes a generator 26 for applying a plurality of charging pulses P1, P2 to the primary transformer winding 30 to keep the transformer from being saturated. A transistor buffer network 36 selectively electrically isolates the output circuit 20 from the transformer. In a particular embodiment the charging pulses P1, P2 serve to maintain the voltage at the control terminal 38 of a power transistor included within the output circuit.

8 Claims, 3 Drawing Sheets

TRANSFORMER DRIVER HAVING UNLIMITED DUTY CYCLE CAPABILITY BY INSERTING NARROW PULSES DURING UNLIMITED DUTY CYCLES

This is a continuation of application Ser. No. 07/733,936, filed Aug. 30, 1991 now abandoned.

BACKGROUND OF THE INVENTION

Field of the Invention

This invention relates to buffer circuits. More specifically, this invention relates to buffer circuits operative to isolate low voltage control networks from relatively high voltage devices such as transistor power switches and the like.

While the present invention is described herein with reference to a particular embodiment, it is understood that the invention is not limited thereto. Those having ordinary skill in the art and access to the teachings provided herein will recognize additional embodiments within the scope thereof.

Description of the Related Art

In many electrical control systems it is necessary to provide an interface between low voltage control signals and relatively high voltage devices such as, for example, power switches. In particular, driver interface circuits have been employed to achieve DC isolation between low voltage logic networks and high-power field effect transistors (FETs) controlled thereby. Certain driver circuits utilize transformers to offer an impedance matching and voltage step-up or step-down capability, as well as to provide essentially complete DC isolation.

However, transformers are constrained by the "constant volt-seconds property" thereof when used to transmit waveforms which alternate between positive and negative voltages. That is, the core flux of the transistor must be reset after the application of a first half-cycle by applying a second half-cycle of opposite polarity. It is necessary that the product of the magnitude and duration of (volts×seconds) the opposing half-cycles are equivalent to preclude residual flux accumulation in the transformer core. For example, if a positive 1 V voltage is applied for three seconds then a succeeding negative voltage applied for one second would need to have a magnitude of −3 V in order to appropriately reset the transformer. Accordingly, the "constant volt-seconds" property induces large voltage swings to occur in transformer drivers operative at high or low duty cycles. Since the voltage range of semiconductor interface circuits is limited, transformer drivers employed therein are typically limited to duty cycles of approximately 50% (i.e. to approximately equal positive and negative pulse widths).

A transformer driver obviating the need to employ a specific +/− voltage ratio for a given duty cycle in order to satisfy the constant volt-seconds property has been proposed by P. Wood in "Transformer-Isolated HEXFET Driver Provides very large duty cycle ratios", *International Rectifier HEXFET Power Mosfet Designer's Manual*, Chapter 9, Application Note 950A (1987). In a particular circuit disclosed by Wood the gate and source of a first field-effect transistor are connected across the secondary of an input transformer. In addition, the gate of the first transistor is coupled to the source of a high-power MOSFET, while the drain of the first transistor is connected to the gate of the MOSFET. When, for example, a logic 1 is applied to the transformer primary the input waveform is reproduced on the secondary winding via the changing core flux until the transformer is saturated. In conventional transformer drivers the collapse of voltage across the secondary winding upon saturation of the transformer would result in the gate-to-source voltage of the power MOSFET dropping below the threshold voltage thereof. This would result in the MOSFET being turned off, thereby limiting the maximum attainable duty cycle.

In contrast, the first transistor included within the Wood circuit serves to isolate the secondary transformer winding from the power MOSFET upon saturation of the transformer. Specifically, an inherent gate-to-drain diode in the first transistor becomes reverse-biased upon saturation of the transformer - thus preventing discharge of the internal gate-to-source capacitance of the MOSFET. In this manner, the MOSFET remains turned on during saturation of the transformer, thus removing the constraint imposed by the transformer constant volt-seconds property upon the duty cycle of the transformer driver. The technique disclosed by Wood is ostensibly capable of providing duty cycles of between one and ninety-nine percent.

Nonetheless, the ability of the transformer driver of Wood to indefinitely maintain the power MOSFET in a turned-on condition is limited by the gate current leakage thereof. That is, the MOSFET in the Wood driver may not be turned on again following discharge of the internal gate-to-source capacitance without first resetting the flux within the input transformer. Again, the flux within the input transformer is reset by the application of a logic 0 control signal to reset the core flux saturation induced by a logic 1 control signal. Yet application of the logic 0 control signal turns the MOSFET off. It follows that the Wood driver appears to be incapable of enabling a MOSFET with a finite input impedance to perpetually remain in the turned on condition. In other words, the transformer driver proposed by Wood would seem unable to effectuate an essentially unlimited duty cycle. Such a feature would be advantageous in, for example, power control applications requiring that the MOSFET change state only very infrequently.

As an alternative to transformer drivers, optical coupling networks have been used to provide an interface between low-level logic signals and high-power circuit elements. Because no transformer is involved, the duty cycle ratio of the waveform provided by the optical network to a high-power MOSFET may be arbitrarily large. Conventional optical networks typically include an electronic amplifier to boost the input logic signal to an appreciable power level. The amplified logic signal is then converted to the optical domain by, for example, a light emitting diode. This optical signal then propagates through air or an optical fiber to a phototransistor, which recovers the information included within the input logic signal. In this manner, the optical coupler effects full DC isolation, but is relatively inefficient. In particular, the signal loss experienced during the electro-optical conversion processes typically necessitates amplification of both the input logic signal and of the driving signal generated by the phototransistor. Accordingly, optical couplers are ill suited for systems having limited power (e.g. spacecraft).

Moreover, optical coupling networks require complex floating power sources and are generally characterized by poor noise immunity and high output impedance. When the optical network is coupled to a MOSFET having a high input impedance, the high output impedance thereof may substantially impair switching speed.

Accordingly, a need exists in the art for a transformer interface circuit capable of driving a high-power field-effect transistor with a waveform having an arbitrarily large duty cycle.

SUMMARY OF THE INVENTION

The need in the art is addressed by the transformer driver of the present invention. The inventive driver is coupled to an output circuit and includes a transformer having primary and secondary windings. A transistor buffer network selectively electrically isolates the output circuit from the transformer. In a particular embodiment, the driver of the present invention further includes a generator for applying a plurality of charging pulses to the primary transformer winding. The charging pulses serve to regulate the voltage at the control terminal of a power transistor included within the output circuit. This invention provides a simple driver for power transistors with DC isolation, low power dissipation and unlimited duty cycle.

DETAILED DESCRIPTION OF THE INVENTION

Figure 1:
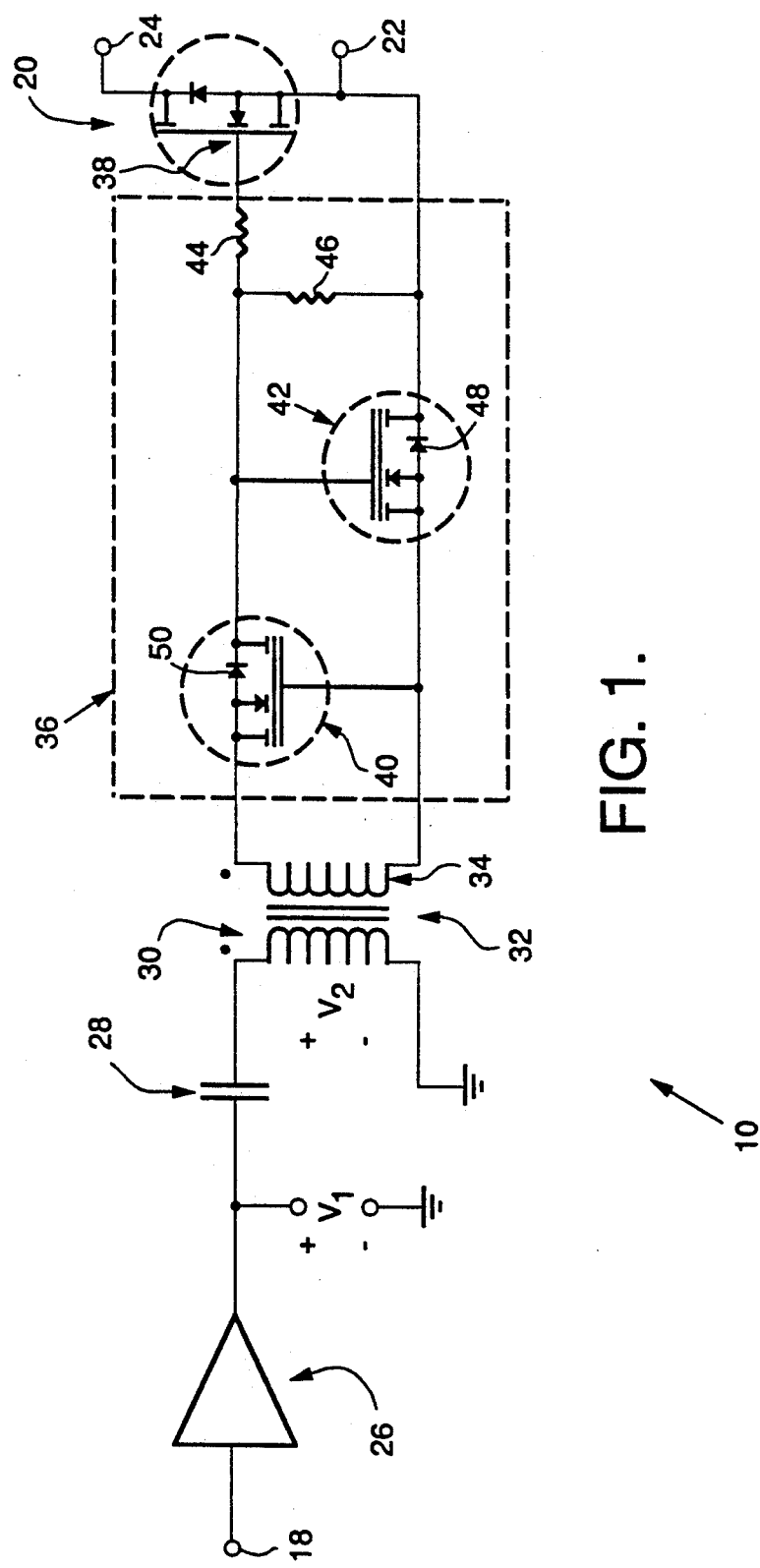
FIG. 1 is an illustrative schematic representation of a preferred embodiment of the unlimited duty cycle transformer driver of the present invention.

FIG. 1 is an illustrative schematic representation of a preferred embodiment of the unlimited duty cycle transformer driver 10 of the present invention. The driver 10 is operative to control a power transistor 20 in response to low voltage signals provided by a logic network (not shown) coupled to an input terminal 18. The power transistor 20 may be realized with, for example, commercially available MOSFET power transistors such as an IRH8150. The logic network coupled to the input terminal 18 can be constructed using any of a variety of techniques well known in the art, see for example, John B. Peatman, The Design of Digital Systems (McGraw Hill Company) or Charles H. Roth, Jr., Fundamentals of Logic Design, Second Edition (West Publishing Company).

In the embodiment of FIG. 1 the transistor 20 is employed to switch, for example, a high voltage power supply or motor drive connected between the source and drain 22 and 24 thereof. In particular, the driver 10 includes a MOSFET driver 26 for providing a control waveform to govern switching of the transistor 20. The control waveform includes, in part, amplified versions of the logic signals impressed upon the input terminal 18 by the logic network. The control waveform is delivered to a voltage doubling capacitor 28 connected in series with a primary winding 30 of a transformer 32. The value of the capacitor 28 will typically be chosen to charge (or discharge) the gate-to-source capacitance of the transistor 20 to the appropriate voltage. The other end of the primary winding is grounded.

The secondary winding 34 of the transformer 32 is coupled to a transistor isolation network 36, which serves to selectively isolate the voltage between a gate 38 and source 22 of the power transistor 20. The network 36 includes first and second transistors 40 and 42 connected as shown between the transformer 32 and a transistor 20, in opposing orientations. Further included within the network 36 is a parasitic-suppressing resistor 44 (typically $\approx 10\Omega$) serially connected to the gate 38. In addition, a static discharge resistor 46 ($\approx 1k\Omega$ to $1M\Omega$) links the gate 38 and source 22 to ensure that the transistor 20 is turned off when power is first applied to the circuit.

As described below, the inventive driver 10 may be operated in an unlimited duty cycle mode to maintain the transistor 20 in either an ON or OFF state for a desired time interval. While in this mode the driver 10 is operative to provide a relatively constant voltage between the gate 38 and source 22 notwithstanding gate leakage of current in the transistor 20. In the ON and OFF states the gate-to-source voltage of the transistor 20 is kept above and below, respectively, the threshold turn-on voltage thereof. The gate-to-source voltage is regulated in part by use of the transistor network 36 to selectively isolate the gate 38 of the transistor 20 from the transformer 32 upon saturation of the latter. In this manner, the gate-to-source capacitance of the transistor 20 is prevented from discharging through the secondary winding 34 upon saturation of the transformer 32. In addition, the charge held by the gate-to-source capacitance of the transistor 20 is supplemented by a plurality of narrow-width charging pulses provided by the MOSFET driver 26. These pulses are of sufficiently limited duration so as not to saturate the transformer 32 nor to change the ON or OFF condition of the power transistor 20. Any of a number of MOSFET drivers, such as the model #TSC4420, by Teledyne Semiconductor, of Mountain View, Calif., may be employed as the driver 26.

Figure 2A:
FIGS. 2a, 2b, 2c, 2d and 2e are timing diagrams illustrating operation of the inventive driver in an unlimited duty cycle mode during first and second intervals, and in a finite duty cycle mode thereafter.
Figure 2B:
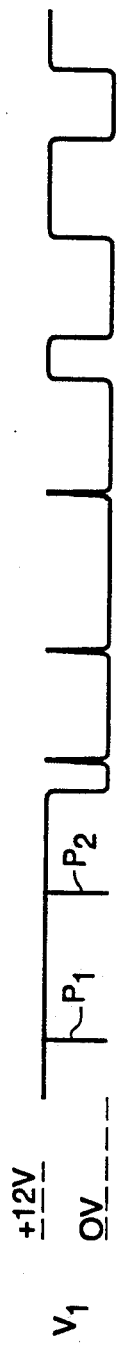
Figure 2C:
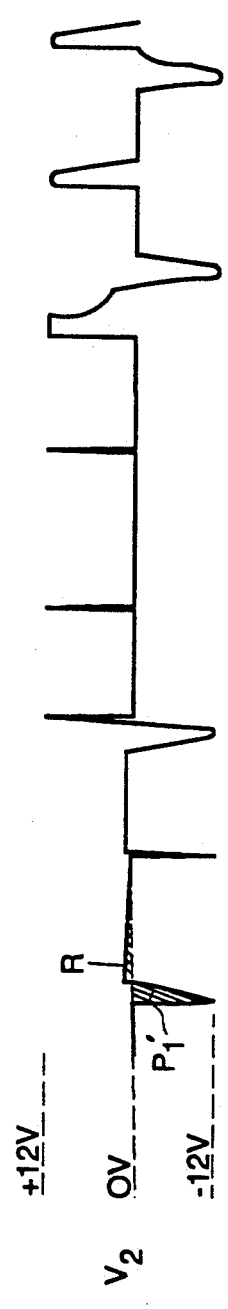
Figure 2D:
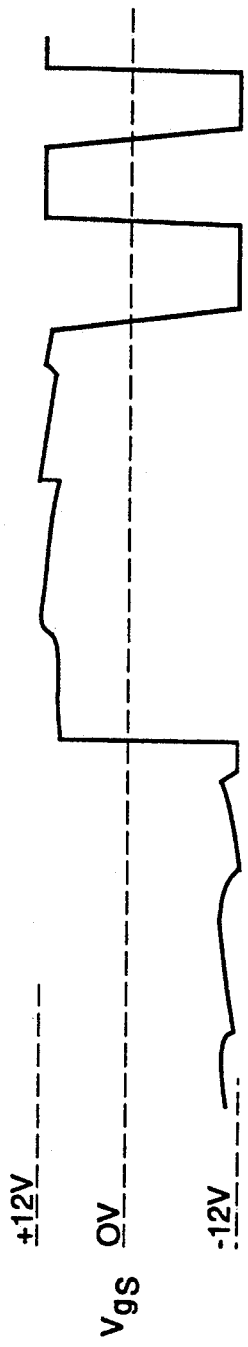
Figure 2E:
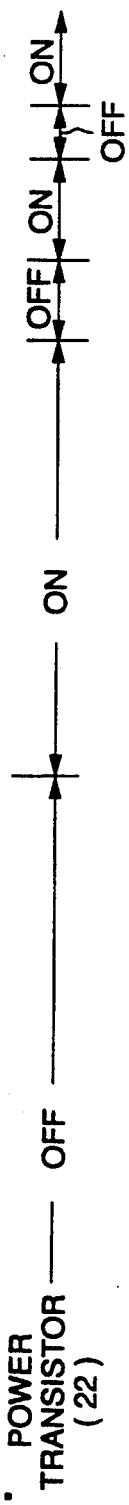

FIGS. 2a, 2b, 2c, 2d and 2e are timing diagrams illustrating operation of the driver 10 in both unlimited and finite duty cycle modes. Referring to FIGS. 2a and 2e, during a first interval the driver 10 is operative in an unlimited OFF mode while during a second interval the driver 10 operates in an unlimited ON mode. While disposed in the unlimited ON and OFF modes the transformer 34 is prevented from saturating, thus allowing charging pulses from the generator 26 to perpetually maintain the transistor 20 in either the turned ON or turned OFF state. In the finite duty cycle mode—exemplified with reference to third, fourth, fifth and sixth intervals—the transistor 20 alternates between the ON and OFF states. In the finite duty cycle mode the transformer 32 is allowed to saturate, which enables the transistor 20 to change state in response to each step change in the control waveform $V_1$ (FIG. 2b) provided by the driver 26. Thus, in the finite duty cycle mode the duty cycle of the power transistor 20 replicates that of the logic signal applied to the input terminal 18.

As shown in FIG. 2c, the finite duty cycle mode is commenced during the third interval by initially raising the voltage across the secondary winding 34 approximately to the turn-on voltage (+12 V) of the transistor 20. While the voltage across the secondary 34 is +12 V, the diode 50, internal to first transistor 40 is forward biased, with the second transistor 42 being turned on. In this condition the gate-to-source voltage $V_{gs}$ of the transistor 20 is charged to approximately 12 V, at which time the internal source to drain diode 50 of the transistor 40 becomes zero-biased. As is indicated in FIG. 2c, the continued application of +12 V to the primary 30 during the third interval causes saturation of the transformer 32 ($V_2$ goes to zero). As $V_2$ goes to zero transistor 40 remains turned off while transistor 42 also becomes turned off. In addition, the internal diode 50 of the transistor 40 becomes reverse biased upon saturation of the transformer 32. At this time, capacitor 28, which had, up to now, exhibited very little voltage drop, begins to charge to VI (12 V).

As shown in FIG. 2b, the control waveform $V_1$ is reduced to zero volts subsequent to saturation of the transformer 32 and the charging of capacitor 28 during the third interval. This reduction induces the voltage $V_2$ across the transformer 32 to go to −12 volts and remain there until the flux therein is reset in accordance with the constant volt-seconds principle. Now transistor 40 is turned on and internal diode 48 conducts, charging the VGs of power transistor 20 to −12 V. As a result of the isolating effect of the internal diode 48 the transistor 20 remains in the OFF state ($V_{gs} \approx -12$ V) after the voltage across the transformer secondary 34 returns to zero due to saturation. As shown in FIGS. 2d and 2e, during the fourth through sixth intervals the transistor 20 alternates between the ON and OFF states in the manner described with reference to the third interval.

As mentioned above, the driver 10 is operative in the unlimited duty cycle mode during the first and second intervals shown in FIG. 2. As is seen with reference to the first interval of FIG. 2b, the charging pulses P1 and P2 are impressed upon the voltage-doubling capacitor 28 by the generator 20. The voltage $V_2$ appearing across the transformer 32 in response to the pulses P1 and P2 is illustrated by FIG. 2c. The narrow pulse used prevented transformer saturation so the voltage across capacitor 28 increased only a volt or so above zero. Hence, inspection of FIG. 2c reveals that the voltage across the transformer 32 becomes slightly positive for a brief period subsequent to the application of each charging pulse. In this manner, the flux within the core of the transformer 32 is reset as mandated by the constant volt-seconds principle. For example, the area below zero volts encompassed by pulse $P_1'$ (FIG. 2c) is substantially equivalent to area $R_1$. Area $R_1$ is bounded by the zero volts threshold and the portion of the waveform $V_2$ immediately following the pulse $P_1'$. A transformer having a 10 turn primary and secondary wound on part #266CT125-3EZA core, produced by Philips/Ferroxcube, Riverside Beach, Fla., may be employed to yield a response substantially similar to that depicted in FIG. 2c.

As shown in FIG. 2d, application of the charging pulses $P_1$ and $P_2$ during the first interval has the effect of maintaining the gate-to-source voltage ($V_{gs}$) of the transistor 20 at approximately negative twelve volts. Specifically, the charging pulses supply charge to the gate-to-source capacitance of the transistor 20 to compensate for any leakage current associated therewith. Since the pulses $P_1$ and $P_2$ are of sufficiently narrow width to avoid either saturating the transformer 32 and appreciably discharging capacitor 28 or turning on the first transistor 40, the transistor 20 may be perpetually kept in the OFF state by employment of the unlimited duty cycle mode depicted in the first interval of FIG. 2. The frequency of application of the charging pulses will depend on, for example, the desired degree of regulation of $V_{gs}$ and the magnitude of the gate leakage current of the transistor 20.

As shown in FIG. 2b, the unlimited ON duty cycle mode of the second interval is initiated by reducing the control waveform $V_1$ to zero volts and discharging capacitor 28. A third charging pulse $P_3$ is then provided by the generator 20 in order to raise $V_{gs}$ to twelve volts and thereby turn on the transistor 20. As described above with reference to the unlimited OFF mode, in the unlimited ON mode fourth and fifth charging pulses $P_4$ and $P_5$ are impressed by the generator upon the capacitor 28 in order to replenish the charge stored by the gate-to-source capacitance of the transistor 20. In this manner, the transistor may be maintained indefinitely in the ON state irrespective of the gate leakage current of the transistor 20. Thus, in contrast to conventional transformer drivers the inventive driver 10 may be operated to provide a switching waveform of virtually any duty cycle.

Figure 3:
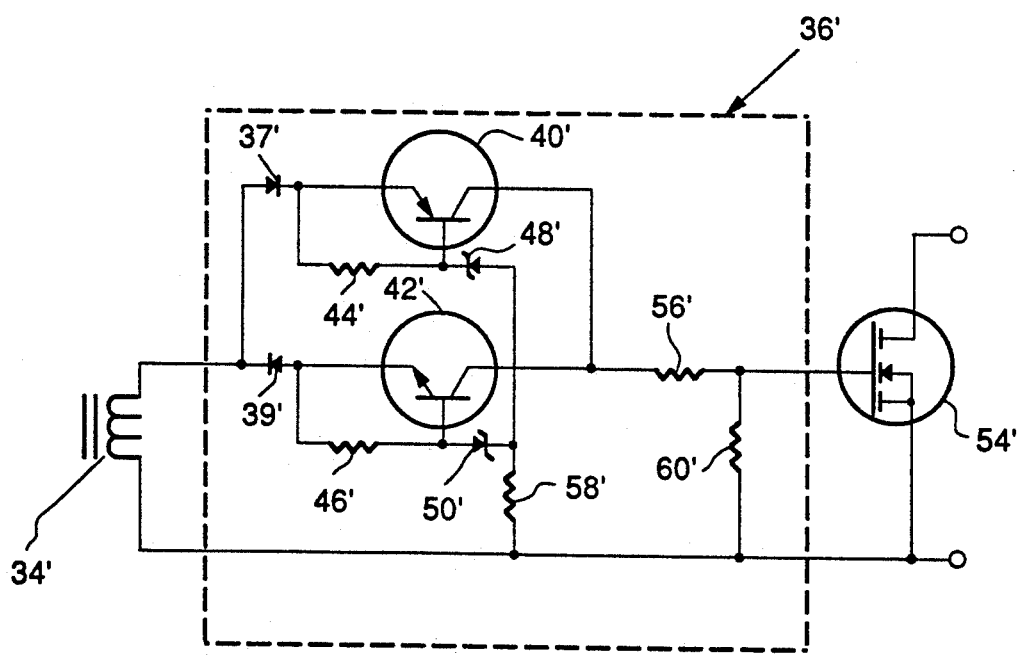
FIG. 3 is a schematic diagram of an alternative embodiment of the unlimited duty cycle transformer driver of the present invention implemented with bipolar transistors.

FIG. 3 shows an alternative transistor buffer network 36' which incorporates bipolar transistors. The network 36' is connected by first and second oppositely oriented diodes 37' and 39' to a secondary transformer winding 34'. The emitter of a PNP bipolar transistor 40' is coupled to the first diode 37', while the emitter of an NPN bipolar transistor 42' is coupled to the second diode 39'. First and second resistors 44' and 46' link the bases of the first and second transistors 40' and 42' to the diodes 37' and 39', respectively. In addition, first and second zener diodes 48' and 50' are also coupled to the bases of the transistors 40' and 42'. In this configuration the buffer 36' operates to selectively isolate the secondary winding 34' and an output circuit 54' in a manner similar to that of the embodiment of FIG. 1 as depicted in FIG. 2. An output transistor 54' is electrically connected to the buffer 36' via fourth, fifth, and sixth resistors 56', 58', and 60' respectively.

While the present invention has been described herein with reference to a particular embodiment, it is understood that the invention is not limited thereto. The teachings of this invention may be utilized by one having ordinary skill in the art to make modifications within the scope thereof. For example, the invention is not limited to an isolation network employing a pair of MOSFET transistors connected as shown. Those skilled in the art may know of other circuit configurations disposed to isolate, with control, the gate-to-source voltage of the power transistor from the secondary winding of the transformer. In addition, the present invention is not limited to driving a power MOSFET. The teachings herein may be utilized by one skilled in the art to design transformer drivers suitable for use in conjunction with other semiconductor switching devices.

It is therefore contemplated by the appended claims cover any and all such modifications.

Accordingly,

What is claimed is:

1. A method for driving an electrical power switch using a driver circuit having a transformer and a transistor isolation network wherein the power switch is coupled to the secondary windings of the transformer through the transistor isolation network, the method comprising:

bringing the power switch to a first state;

applying a narrow electrical pulse of a first voltage polarity to the primary windings of the transformer, the pulse being narrow enough not to saturate the transformer, to compensate for any leakage in the driver circuit and the power switch and maintain the power switch in the first state; and repeating the step of applying a pulse to maintain the power switch in the first state until a change of power switch state is desired.

2. The method of claim 1 wherein the step of bringing the power switch to a first state comprises applying a direct bias current of a first voltage polarity to the primary windings of the transformer to saturate the transformer.

3. The method of claim 1 wherein the step of applying a pulse comprises applying logic signals generated in an integrated circuit logic network.

4. The method of claim 1 wherein the step of applying a pulse comprises applying a narrow electrical pulse to the primary windings of the transformer through a capacitor coupled in series with one end of the transformer primary windings.

5. The method of claim 1 wherein the step of applying a pulse comprises applying a narrow electrical pulse to the primary windings of the transformer through a voltage doubling capacitor coupled in series with one end of the transformer primary windings.

6. The method of claim 1 further comprising, after the step of repeating, the steps of:

applying a direct bias current of the same polarity as the pulse to saturate the transformer;

applying a narrow electrical pulse of an opposite second voltage polarity to the primary windings of the transformer, the pulse being narrow enough not to saturate the transformer, to bring the power switch to a second state;

applying a second narrow electrical pulse of an opposite polarity to compensate for any leakage in the driver circuit and the power switch and maintain the power switch in the second state; and repeating the step of applying a pulse of an opposite polarity to maintain the power switch in the second state until a change of power switch state is desired.

7. The method of claim 1 further comprising, after the step of repeating, the step of applying successive pulses of alternating polarity sufficient to saturate the transformer to switch the state of the power switch to successive alternating states.

8. The method of claim 1 wherein the electrical power switch comprises a metal oxide semiconductor field effect transistor.

* * * * *